United States Patent [19]

Erbil

[11] Patent Number: 4,927,670

[45] Date of Patent: May 22, 1990

[54] CHEMICAL VAPOR DEPOSITION OF MIXED METAL OXIDE COATINGS

[75] Inventor: Ahmet Erbil, Atlanta, Ga.

[73] Assignee: Georgia Tech Research Corporation, Atlanta, Ga.

[21] Appl. No.: 210,023

[22] Filed: Jun. 22, 1988

[51] Int. Cl.$^5$ .................... C23C 16/00; B05D 5/12
[52] U.S. Cl. .................. 427/255.3; 427/255.2; 427/255.1; 427/255; 427/248.1; 427/62; 427/314; 505/1; 505/734; 556/43; 556/112; 556/140
[58] Field of Search ............ 427/62, 63, 255.3, 255.2, 427/255.1, 314, 255, 248.1; 556/43, 112, 140; 260/429; 505/1, 734

[56] References Cited

U.S. PATENT DOCUMENTS

| | | | |
|---|---|---|---|
| 2,976,304 | 3/1961 | De Witt et al. | 260/429 |
| 3,032,569 | 5/1962 | Freeman et al. | 260/429 |
| 3,061,464 | 10/1962 | Norman et al. | 427/252 |
| 3,064,020 | 11/1962 | Riemschneider | 260/429 |
| 3,288,829 | 11/1966 | Wilkinson | 260/429 |
| 3,914,515 | 10/1975 | Kane et al. | |
| 4,501,602 | 2/1985 | Miller et al. | 427/255 |

OTHER PUBLICATIONS

Berry et al "Formation of high Tc superconducting films by organometallic chemical vapor deposition" Appl. phys. lett. 52(20) May 1988, pp. 1743–1744.

Dryatykh et al "The Synthesis and Vapor Pressures of Trisisoproplcyclopentadienyl Complexes of lanthanum, Praseodymiun, and Neodymium" Russian Journal of Inorganic Chemistry, 25(8) 1980 pp. 1168–1170.

J. L. Vossen, et al., ed., "Thin Film Processes", Academic Press, 1978, pp. 257–331.

Primary Examiner—Michael Lusigman
Assistant Examiner—Roy V. King
Attorney, Agent, or Firm—Oldham & Oldham Co.

[57] ABSTRACT

Mixed metal oxide films containing Group IIa metals and transition metals are deposited on a heated substrate by a chemical vapor deposition process using alkylcyclopentadienyl metal compound precursors and an oxidizing agent.

11 Claims, No Drawings

CHEMICAL VAPOR DEPOSITION OF MIXED METAL OXIDE COATINGS

REFERENCE TO PRIOR APPLICATION

This application is related to applicant's copending commonly assigned applications Ser. Nos. 209,999, 210,020, now U.S. Pat. No. 4,882,206; 210,022, now U.S. Pat. No. 4,880,670; and 210,079, all filed on June 22, 1989.

TECHNICAL FIELD

This invention relates to vapor deposition processes for forming mixed metal oxide coatings.

BACKGROUND ART

Formation of transition metal oxide coatings on substrates by chemical vapor deposition is known. For example, U.S. Pat. No. 3,914,515 describes depositing semi-transparent films of transition metal oxides, in particular iron oxide and nickel oxide, by contacting a cyclopentadienyl metal compound, such as dicyclopentadienyl iron, with a heated glass substrate. "Thin Film Processes", 1978, pages 258–331, edited by J. L. Vossen and W. Kern and published by Academic Press, New York, describes formation of thin films chemical vapor deposition (CVD). Metal oxide films are discussed on pages 290–297. Such metal oxide coatings are reported to be useful in photomasks, insulators, semiconductors, and transparent conductors, and as protective coatings for high temperature materials.

Very recently, certain mixed metal oxides which are superconductors at temperatures up to the boiling point of liquid nitrogen (77° K., or −196° C.) or slightly above, have been discovered. For example, M. K. Wu, et al., Phys. Rev. Lett. 58, 908 (1987) and D. W. Murphy, et al., Phys. Rev. Lett. 58, 1988 (1987). In general, these new materials may be represented by the formula $A_2BCu_3O_w$ 

where A is a Group IIA metal of the group consisting of calcium, strontium and barium, B is a Group IIIB metal, and w is from 6.5 to 8. Superconductors have the potential for revolutionizing microelectronics and electric power transmission and making practical certain devices (such as magnetic levitation devices) that are impractical at present. While superconductors and methods for their synthesis so far have very serious drawbacks, the field appears to offer great promise as new mixed metal oxide compositions and new methods of synthesis are discovered.

Chemical vapor deposition has been extensively described in the literature (including patents) as a technique for depositing metals, alloys and certain metal compounds. While the technique has been described with reference to most transition metals and to certain other metals and metalloids (silicon, for example), commercial use of CVD for the most part has been confined to deposition of a few metals and metal compounds, such as silicon, tungsten, and certain III–V and certain II–VI compounds (denoting, respectively, a compound of a Group III metal and a Group V element, and a compound of a Group II metal and a Group VI element). The absence of suitable heat decomposable organometallic compounds for elements other than those mentioned above appears to have limited the extension of CVD to the deposition of other metals or compounds.

DISCLOSURE OF THE INVENTION

An object of this invention is to provide novel chemical vapor deposition processes for preparing mixed metal oxides, in which heat decomposable organometallic compounds which are either novel or have not been used hitherto in CVD, are used as metal sources or precursors.

This invention according to one aspect provides a process for preparing a composite article comprising a thin mixed metal coating on a substrate, which comprises contacting a heated substrate with (1) an oxidizing gas stream and (2) a carrier gas stream containing heat decomposable organometallic compounds yielding on decomposition two or more metals of different groups of the Periodic Table and each selected from the group consisting of metals of Group IIA of the Periodic Table and transition metals, said heat decomposable organometallic compounds including at least one compound of the following formula (I)

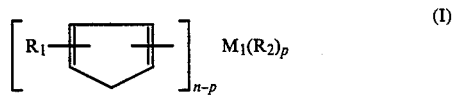 (I)

wherein:
  $M_1$ is a metal of Group IIA, IIIB, IVB, VB, VIB, VIIB or VIII of the Periodic Table,
  $R_1$ is a lower alkyl or lower alkenyl radical of about 2 to about 6 carbon atoms,
  $R_2$ is hydrogen, fluorine, a lower alkyl radical of 1 to about 6 carbon atoms, or a lower alkenyl radical of 2 to about 6 carbon atoms;
  n is the valence of M and is an integer from 2 to 4, and
  p is an integer from 0 to (n−1); or a compound of the following formula (II)

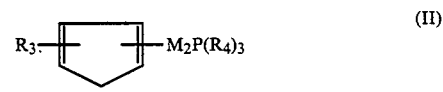 (II)

wherein:
  $M_2$ is a metal of Group IB of the Periodic Table,
  $R_3$ is a lower alkyl radical of 1 to about 6 carbon atoms, or a lower alkenyl radical of 2 to about 6 carbon atoms,
  $R_4$ is a lower alkyl radical of 1 to about 6 carbon atoms;

the temperature of said substrate being above the decomposition temperature of said organometallic compounds.

In the above formulas and accompanying definitions, "Group IIA metal" is preferably magnesium, calcium, strontium or barium; "Group VIII metal" is preferably iron, cobalt, nickel, ruthenium, rhodium, osmium or iridium; and "Group IB metal" is preferably copper or silver. Also, $R_1$ and $R_3$ are preferably each lower alkyl radicals of 2 to 4 carbon atoms.

Best results are obtained when organometallic precursor compounds of the formula (I) are selected in accordance with the following provisos:

(1) $M_1$ is a metal of Group IIA, IIIB, IVB, VB, VIB, or VIII when p=0;

(2) $M_1$ is a Group IV metal and n=3 or 4 when $R_2$ is fluorine;

(3) $M_1$ is a metal of Group VB, VIB or VIIB when $R_2$ is hydrogen; and (4) $M_1$ is a Group VIII metal when $R_2$ is lower alkyl, lower alkenyl, cycloalkyl, cycloalkenyl or cycloalkadienyl.

This invention according to another aspect thereof provides metal oxide-coated articles in which the metal oxide coating has the general formula $$A_u B_x Cu_y O_z$$

where A and B, and z are as previously defined, u, x and y are each from 1 to about 10 and z is from 3 to about 40. In particular, this invention provides novel superconductive articles comprising a substrate and a metal oxide coating having the formula $$A_2 B Cu_3 O_w$$

where A, B and w are as previously defined. The metal oxide coating layer is the superconductor.

All symbols, i.e., A, B, $M_1$, $M_2$, $R_1$, $R_2$, $R_3$, $R_4$, n, p, q, u, w, x, y, and z have the same definitions throughout the specification and claims, subject to the provisos where specifically stated to be applicable.

BEST MODE FOR CARRYING OUT THE INVENTION

The heat decomposable organometallic compounds which are used as precursors in the practice of this invention meet the following requirements: (1) they are liquids at 100° C., (i.e., the melting points are below 100° C.); (2) they have vapor pressures of at least 0.1 torr at 100° C.; (3) they clearly decompose to deposit metal with little or no carbon incorporation (i.e., not more than about 5 percent by weight of carbon in the metal); (4) they are thermally stable at temperatures below about 150° C.; and (5) they thermally decompose with the deposition of metal at a temperature from about 150° to about 1000° C.

The low melting points and the large temperature difference between the melting point and the decomposition temperature of precursor compounds used herein make it possible to disperse the liquid precursors into a carrier gas stream at convenient operating temperatures without risk of premature decomposition. High vapor pressure at 100° C., assures a sufficiently high concentration of precursor in carrier gas for effective metal oxide deposition. The thermal decomposition temperatures of the precursors are low enough for economical operation, with few if any requirements for special high temperature resistant equipment in most cases. Finally, precursors herein give highly pure deposits under suitable deposition conditions.

The precursors used herein meet the above requirements and generally have lower melting points, higher vapor pressures at 100° C., and greater temperature differences between the melting point and the decomposition temperature, than their cyclopentadienyl metal analogs in which the cyclopentadienyl radical is unsubstituted.

Preferred organometallic precursor compounds for depositing Group IIA metal oxides and oxides of Group IIIB to Group VIII metals are as follows:

(1) Metal alkylcyclopentadienyls of formula (I) given previously in which p=0, $R_2$ is absent, and $M_1$ is a metal of Group IIA, IIIB, IVB, VB, VIB or VIII.

(2) Alkylcyclopentadienyl metal fluorides of formula (I) in which $R_2$=F and $M_1$ is a Group IVB metal. (3) Alkylcyclopentadienyl metal hydrides of formula (I) in which $R_2$=H and $M_1$ is a metal of Group VB, VIB, VIIB. (4) Alkylcyclopentadienyl metal compounds in which $R_2$ is alkyl ($C_1$-$C_6$) or alkenyl ($C_2$-$C_6$) and M is a group XVIII metal.

The above preferred precursor compounds are indicated in tabular form in TABLE 1 below, in which the columns give the various possible values of $R_2$ the rows give groups of the Periodic Table which are included within the definition of $M_1$. An "x" at the intersection of given row and column denotes a preferred group of compounds.

TABLE I

| Metal Group | Preferred CVD Precursors of Formula I | | | |
|---|---|---|---|---|
| | $R_2$ is Absent | $R_2$ = F | $R_2$ = H | $R_2$ = HC* |
| IIA | X | | | |
| IIIB | X | | | |
| IVB | X | X | | |
| VB | X | | X | |
| VIB | X | | X | |
| VIIB | | | X | |
| VIII | X | | | X |

*HC in TABLE I denotes alkyl of 1 to 6 carbon atoms or alkenyl or 2 to 6 carbon atoms.

Copper and silver oxides may be deposited by decomposition of a compound of the formula (II) above, as previously described.

Metals which can be deposited according to this invention are (1) metals of Group IIA of the Periodic Table, and (2) transition metals, i.e., metals of Groups IIIB, IVB, VB, VIB, VIIB, VIII and IB. The term "transition metal", as used herein is as defined in The Condensed Chemical Dictionary, 10th edition, 1981, page 1036, revised by G. G. Hawley; published by Van Nostrand Reinhold Company, New York. The groups of the Periodic Table are according to the usage of The Condensed Chemical Dictionary, 10th edition, supra, page 789. By way of example, without limitation thereto, metals which can be deposited in accordance with this invention include magnesium, calcium, strontium and barium (Group IIA); scandium, yttrium, lanthanum, cerium, praseodymium, neodymium, samarium, europium, gadolinium, terbium, dysprosium, holmium, erbium, thulium, ytterbium, lutecium, thorium, uranium and plutonium (Group IIIB including lanthanide); titanium, zirconium and hafnium (Group IVB); vanadium, niobium and tantalum (Group VB); chromium molybdenum and tungsten (wolfram) (Group VIB); manganese and rhenium (Group VIIB); iron, cobalt, nickel, ruthenium, rhenium, palladium, osmium, iridium and platinum (Group VIII), and copper and silver (Group IA).

The substituent $R_1$ on the cyclopentadienyl ring can be any lower alkyl radical containing from 2 to about 6 carbon atoms, i.e., ethyl, propyl (i.e., n-propyl), isopropyl, butyl (i.e., n-butyl) isobutyl, sec.-butyl and tert.-butyl, the pentyl radicals and the hexyl radicals; or any lower alkenyl radical containing from 2 to about 6 carbon atoms such as vinyl, allyl, 1-butenyl, 2-butenyl, or 3-butenyl, etc.

Representative organometallic precursor compounds of formula (I) which are suitable for depositing Group IIA metal and transition metal (Groups IIIB to VIII) oxides include the following:

Group IIA: bis(isopropylcyclopentadienyl) magnesium, bis(isopropylcyclopentadienyl) calcium, bis(isopropylcyclopentadienyl) strontium, bis(ethylcyclopentadienyl) barium, bis(isopropylcyclopentadienyl) barium, bis(butylcyclopentadienyl) barium, and bis(tert.-butylcyclopentadienyl) barium.

Group IIIB: bis(isopropylcyclopentadienyl) scandium, bis(ethylcyclopentadienyl) yttrium, bis-(isopropylcyclopentadienyl) yttrium, bis(butylcyclopentadienyl) yttrium, bis(isopropylcyclopentadienyl) lanthanum, bis(isopropylcyclopentadienyl) cerium, bis(isopropylcyclopentadienyl) praseodymium, and bis(isopropylcyclopentadienyl) neodymium.

Group IVB: bis(isopropylcyclopentadienyl) titanium, bis(isopropylcyclopentadienyl) zirconium, bis(isopropylcyclopentadienyl) hafnium, (isopropylcyclopentadienyl) titanium; di(isopropylcyclopentadienyl) titanium difluoride, di(isopropylcyclopentadienyl) zirconium difluoride, and di(isopropylcyclopentadienyl) hafnium difluoride, isopropylcyclopentadienyl titanium difluoride.

Group VB: bis(isopropylcyclopentadienyl) vanadium, tetra(isopropylcyclopentadienyl) niobium, and tetra(isopropylcyclopentadienyl) tantalum; isopropylcyclpentadienyl tantalum dihydride.

Group VIB: bis(isopropylcyclopentadienyl) chromium and tetra(isopropylcyclopentadienyl) molybdenum; di(isopropylcyclopentadienyl) molybdenum dihydride, and di(isopropylcyclopentadienyl) tungsten dihydride.

Group VIIB: bis(isopropylcyclopentadienyl) manganese, isopropylcyclopropylcyclopentadienyl manganese hydride, and di(isopropylcyclopentadienyl) rhenium monohydride.

Group VIII: bis(isopropylcyclopentadienyl) iron, bis(isopropylcyclopentadienyl) cobalt, bis(isopropylcyclopentadienyl) ruthenium, bis(isopropylcyclopentadienyl) osmium, and bis(isopropylcyclopentadienyl) iridium; isopropylcyclopentadienyl nickel isopropyl, and isopropylcyclopentadienyl nickel allyl.

Numerous organometallic compounds of formula (I) which are suitable as precursors have not been specifically named, in order to avoid an unduly lengthy list. Only isopropylcyclopentadienyl metal compounds have been named in most cases; the lower alkylcyclopentadienyl metal homologs in which the lower alkyl substituent $R_1$ is any lower alkyl or alkenyl radical of 2 to about 6 carbon atoms, are equally suitable. Similarly, not all possible hydrocarbon radicals $R_2$ have been specifically named.

Copper and silver compounds of the formula (II) given above are suitable copper and silver oxide precursors. In these compounds, $R_3$ and $R_4$ may be methyl, ethyl, propyl (i.e., n-propyl), isopropyl, butyl (i.e., n-butyl), isobutyl, sec.-butyl and tert.-butyl, etc. $R_3$ additionally may be vinyl, allyl, 1-butenyl, etc. Representative copper oxide precursors of formula (II) include ethylcyclopentadienyl copper triethyl-phosphine and isopropylcyclopentadienyl copper triethylphosphine.

While it is possible to use one or more precursors which are not in accordance with either formula (I) or formula (II), it is preferred to use only precursors which do conform to these formulas and to the provisos. In any case, at least one precursor of either formula (I) or formula (II) should be used, and all precursors would meet the requirements stated earlier.

One or more metal oxides can be deposited in accordance with this invention. To deposit mixed oxides, oxides of metals from at least two different groups of the Periodic Table should be deposited. Oxides of two or more metals from the same group of the Periodic Table may be deposited if desired.

A mixture of metal oxides which may be represented by the general formula $$A_u B_x Cu_y O_z$$

where A, B, u, x, y and z are as previously defined, may be deposited on a substrate in accordance with preferred embodiments of this invention. A superconductive metal oxide mixture having the formula $$A_2 B Cu_3 O_w$$

(i.e., a mixture according to the general formula in which $u=2$, $x=1$, $y=3$ and $z=6.5-8$), is deposited in accordance with a particularly preferred embodiment of this invention. This mixture behaves as a superconductor, i.e., it has little or no electrical resistance, at temperatures up to the boiling point of liquid nitrogen (77° K., or −196° C.) or higher. Also, they exhibit partial or total magnetic flux exclusion, which is known as Meissner effect. The thin mixed metal coating normally forms the entire conductive path; the substrate typically neither contributes to nor detracts from conductivity. An especially preferred superconductive metal oxide mixture has the formula $$Ba_2 Y Cu_3 O_w$$

The value of w is variable because of the defect structure in the material and is in the range of 6.5 to 8.

Preferred precursors for deposition of the metal oxide mixtures described in the preceding paragraph are:

(1) a Group IIA metal compound of the following formula (III)

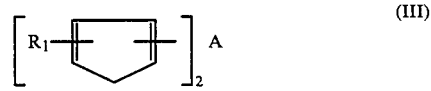

(III)

(2) a Group IIIB metal compound of the following formula (IV)

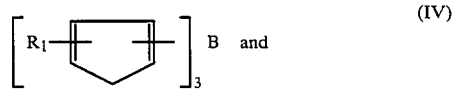

(IV)

(3) a copper compound of the formula (II-a).

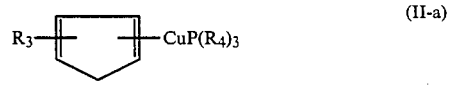

(II-a)

It will be noted that formulas (III) and (IV) are simply special cases of formula (I), and formula (II-a) is a special case of formula (II).

Other suitable precursors for Group IIA metals are compounds of the following formula (V)

$$A(C_5H_{7-q}F_qO_2)_2 \quad (V)$$

or the following formula (VI)

$$A(OR_5)_2 \quad (VI)$$

wherein $R_5$ is an alkyl radical containing from 1 to about 12 carbon atoms, preferably from about 6 to about 10, and q is 0 or an integer from 1 to 7. A is previously defined and is preferably barium.

Representative compounds of formula (V) include barium diacetylacetonate, barium di(trifluoroacetylacetonate), and barium di(hexafluoroacetylacetonate).

Representative compounds of formula (VI) include barium dimethoxide, barium diethoxide, barium di-n-butoxide, barium diisobutoxide, barium di-sec-butoxide, barium di-tert-butoxide, the barium dihexonides, the barium dioctyloxides and the barium didecyloxides.

Preferred precursor mixtures for use according to this invention include mixtures in which the precursors consist essentially of two or more compounds chosen from the group consisting of compounds of formulas (I) through (VI).

Representative precursor compounds are the Group IIA organometallic compounds, the Group IIIB organometallic compounds, and the copper compounds previously named.

Organometallic precursor compounds of Formula (I) can be prepared by either General Method A or General Method B as described below.

Method A. This method proceeds according to the following equations (1) through (3)

$$C_5H_6 + Na \rightarrow NaC_5H_5 + \tfrac{1}{2}H_2 \quad (1)$$

$$NaC_5H_5 + R_1Br \rightarrow R_1C_5H_5 + NaBr \quad (2)$$

$$2R_1C_5H_5 + M_1 \rightarrow (R_1C_5H_4)_2M_1 + H_2 \quad (3)$$

This method is particularly suitable for preparing alkaline earth metal (i.e., Group IIA) compounds, such as compounds of calcium, strontium and barium. Sodium cyclopentadienide may be prepared according to equation (1) by reacting monomeric 1,3-cyclopentadiene in an inert solvent such as tetrahydrofuran (THF) with an excess of metallic sodium. The resulting sodium cyclopentadienide may be reacted in another vessel (away from excess sodium) with a lower alkyl or alkenyl bromide (e.g., isopropyl bromide) according to equation (2) by adding the alkyl bromide through a dropping funnel. The resulting sodium bromide is allowed to settle. The alkylcyclopentadiene solution produced may be separated from the sodium bromide and the solvent (e.g., THF) by fractional distillation. Finally, the alkylcyclopentadiene (e.g., isopropylcyclopentadiene) may be mixed with an inert gas (e.g., argon) and passed through a quartz tube heated to 500°–600° C. and containing chips of the desired metal (e.g., calcium, strontium or barium). A reaction according to equation (3) ensues, producing a bis(alkylcyclopentadienyl) metal compound, such as bis(isopropylcyclopentadienyl) strontium, which may be represented by either formula (I) or formula (III).

Method B. An alkyl-substituted cyclopentadiene of the formula $R_1C_5H_5$ is prepared according to equations (1) and (2) in Method A above. The method then proceeds according to equations (4) and (5) below.

$$R_1C_5H_5 + Na \rightarrow R_1C_5H_4Na + \tfrac{1}{2}H_2 \quad (4)$$

$$3R_1C_5H_4Na + M_1Cl_3 \rightarrow (R_1C_5H_4)_3M_1 + 3\,NaCl \quad (5)$$

Reaction (4) is carried out in an anhydrous organic solvent that does not react with sodium metal, such as tetrahydrofuran (THF). Reaction (5) is also carried out in an anhydrous organic solvent, which may be THF.

Method B is especially suitable for preparing precursor compounds in which the precursor metal is a transition metal of Group IIIB through Group VIII.

Compounds of formula (I) in which $R_2$ is present (i.e., in which p is not zero) can be prepared according to methods disclosed in applicant's copending commonly assigned application Ser. No. 210,079, filed of even date and entitled "Chemical Vapor Deposition of Transition Metals". Compounds of formula (I) in which $R_2 = F$ can be prepared by following the procedures given in "Basic Organometallic Chemistry"; 1981 by Haidue and Zuckerman; published by de Gruyter; p. 314, and in U.S. Pat. No. 3,038,915; by using allyl or alkenyl substituted cyclopentadiene.

Method C. This method is particularly suited for preparing copper compounds of formula (II). An alkyl substituted cyclopentadiene of the formula $R_3C_5H_5$ may be prepared according to equations (1) and (2) in Method A wherein $R_3$ is substituted for $R_1$. The alkyl substituted cyclopentadiene is then reacted with a trialkyl phosphine according to equation (6) below:

$$2R_3C_5H_5 + Cu_2O + 2P(R_4)_3 \rightarrow 2(R_3C_5H_4)CuP(R_4)_3 + H_2O \quad (6)$$

Reaction (6) may be carried out in an inert anhydrous organic solvent such as THF.

The oxidizing agent may be any gaseous reactant which is capable of reacting with the organometallic precursor compounds at the decomposition temperatures of the latter to form metal oxide deposits. Oxygen compounds, such as nitrous oxide, carbon dioxide, THF (tetrahydrofuran) and steam, are better suited than oxygen or air to the deposition of metal oxides because the oxygen compounds react with organometallic compounds only at high temperatures. The oxidizing agent may be introduced into the reactor in admixture with a carrier gas. For example, nitrous oxide/nitrogen and carbon dioxide/hydrogen oxidizing mixtures are suitable.

The substrate can be any material, usually either metallic or ceramic, on which an adherent metal oxide coating can be formed and which can be heated to a temperature above the decomposition temperatures of the precursor compounds. Thus, the substrate, can be a ceramic material such as glass or quartz, or a metal such as iron, nickel, titanium, tungsten, copper or aluminum. Aluminum and other low melting metals having melting points below 1000° C. are not suitable when any precursor compound to be used has a decomposition temperature above or close to the melting point of the metal. Similarly, a glass whose softening point is below the decomposition temperature of any desired precursor compound cannot be used. Generally, only heat resistant glasses can be used.

The substrate can be of any desired shape, either regular or irregular. Thus, the substrate can be a rectangular solid or other solid characterized by flat exterior surfaces. Cylindrical surfaces, such as rods and wires, can also be coated according to this invention. Spherical surfaces and other curved surfaces can also be coated. The substrate can even be hollow, as for example, a tube or a hollow sphere having openings to the exterior.

Ductile metallic rods and wires are preferred substrates, particularly when the desired finished article is a superconductor.

Mixed metal oxide coatings of any desired composition can be obtained by appropriate selection of precursor compounds. The mixed metal oxide coatings prepared in accordance with this invention consist essentially of two or more oxides of Group IIA or transition metals, including oxides of metals from at least two groups of the Periodic Table. Oxides of more than one metal from the same group of the Periodic Table may be prepared. All precursor compounds should meet the requirements for precursor compounds stated earlier. At least one precursor compound should be an organometallic compound according to either formula (I) or formula (II). Preferably, all precursor compounds are compounds of either formula (I) or formula (II). Most precursors are monometallic, requiring the use of a separate precursor for each metal whose oxide is to be deposited. Some bimetallic precursor compounds meet the requirements stated earlier and may be used. An advantage of using a separate precursor compound for each metal is that the oxides of any two or more metals may be deposited in any desired proportions.

Preferred metal oxide coatings are those consisting essentially of oxides of a Group IIA metal, a Group IIIB metal and copper. These metal oxides may be represented by the general formula $A_uB_xCu_yO_z$ where A represents one or more metals of Group IIA, B represents one or more metals of Group IIIB, and u, x, y and z are as previously defined. In particular, the metal oxide coating may have a composition represented by the general formula $A_2BCu_3O_z$. Preferred precursors for depositing these metal oxide coatings are (1) one or more Group IIA metal compounds of formula (III), (2) one or more Group IIIB metal compounds of formula (IV), and (3) one or more copper compounds of formula (II). Both formula (III) and formula (IV) are special cases of formula (I) as explained earlier. More broadly, not all precursor compounds must conform to formula (III), (IV) or (II), provided that at least one of them does.

Especially preferred metal oxide coatings are those represented by the formula $Ba_uY_xCu_yO_z$ most particularly by the formula $Ba_2YCu_3O_w$. Coatings of the last-named formula are superconductive. These coatings may be deposited by decomposition of a precursor mixture of (1) a barium compound of formula (III), (2) an yttrium compound of formula (IV), and (3) a copper compound of formula (II). Representative precursors are di(isopropylcyclopentadienyl) barium, tri(isopropylcyclopentadienyl) yttrium, and ethylcyclopentadienyl copper triethylphosphine.

The desired mixed metal oxide coating can be formed on the desired substrate by methods known in the art. Conventional chemical vapor deposition (CVD), chemical beam epitaxy (CBE) or metal-organic molecular beam epitaxy (MO-MBE) techniques, and variations thereof, can be used. In conventional CVD the reactants are carried into the deposition region by carrier gas flow. Where, as here, a metal oxide coating is to be formed on a heated substrate, it is usually desirable to convey the organometallic precursor compounds and the oxidizing agent to the substrate in separate carrier gas streams in order to avoid premature reaction. In CBE or MO-MBE, the reactants are introduced into a vacuum chamber and expanded to form molecular beams. The molecular beams strike the hot substrate and deposit metals, which are oxidized by an oxidizing gas stream to the corresponding oxides. Conventional CVD, CBE and MO-MBE techniques have been described in the literature, particularly the literature pertaining to deposition of silicon and III-V and II-VI compounds.

The foregoing processes can be carried out in any apparatus which includes a gas-tight chamber or gas space having means for supporting a substrate, means for heating this substrate to a temperature above the decomposition temperature of the decomposable metal compound, an inlet conduit for admitting gas or vapor streams of decomposable organometallic compound and oxidizing agent, and an outlet conduit for removing a stream of carrier gas, decomposition products and undecomposed metal compound from the chamber. Suitable apparatus of various types are well known in the art.

For CVD processes it is preferred to supply both the organometallic compounds and the oxidizing agent in streams of carrier gas. The preferred carrier gas for the organometallic compounds is hydrogen, argon or nitrogen or a mixture of these. The desired mole fraction of each organometallic compound can be achieved by bubbling the carrier gas through a body or pool of the liquid organometallic compound at a rate and bubbler temperature (which is the same as the pool temperature) which will give the desired mole fraction. The bubbler temperature is typically from the melting point of the organometallic compound to 100° C. The various organometallic compounds are preferably entrained in separate carrier gas streams, which after entrainment are combined into a single carrier gas stream, which is supplied to the reactor in which metal oxide deposition takes place. The mole ratios of the metals in the combined carrier gas stream is typically but not necessarily the same as the mole ratios of the metals in the metal oxide deposit, since metals do not always deposit in the same proportion as that in which they are present in the carrier gas. It is possible to supply the organometallic compounds in undiluted form at reduced pressure (say about 0.1 atmosphere or less) to the reactor, but use of a carrier gas is generally preferred because it affords better process control and does not require high vacuum equipment. CVD according to the invention can be conducted at pressures in the range of about 0.1 to about 760 torr. The oxidizing agent (e.g., nitrous oxide, carbon dioxide, THF or steam) is also preferably contained in a non-oxidizing carrier gas. For example, nitrous oxide may be diluted with nitrogen, and carbon dioxide and steam can be diluted with hydrogen. Separate streams of organometallic compounds and oxidizing agents are supplied to avoid premature decomposition of the organometallic compounds.

In MO-MBE or CBE processes, the precursors are supplied as separate streams to a high vacuum reactor and impinged line of sight in the form of molecular beams on to a heated substrate.

The substrate temperature for all processes according to this invention, whether CVD, MO-MBE or CBE is above the decomposition temperature of the organometallic precursor compound having the highest decomposition temperature, and is in the range of 150° C. to 1000° C. For example a suitable substrate temperature for deposition of a barium oxide-yttrium oxide-copper oxide superconductor coating is in the range of 600°–1000° C., regardless of which process is used. CVD processes using a carrier gas are typically carried out in the pressure range of 0.1–760 torr although higher or lower pressures can be used. MO-MBE and CBE processes, the reactor pressure is typically about $10^{-5}$ torr during crystal growth (i.e., while organometallic compounds are actually being supplied to the substrate), with a typical background pressure from $10^{-10}$ to $10^{-9}$ torr. The low background pressure in MO-MBE allows for fast switching of material composition, which is important in growing ultra thin layers and other multi-layer coatings in which there are abrupt composition and sloping changes from layer to layer.

Decomposition products are removed from the reactor in all processes herein described via the outlet provided for that purpose.

Products of this invention may have any desired metal oxide coating thickness ranging from monomolecular up to about one millimeter. A preferred range of thickness is from about 0.1 to about 100 microns, especially from about 0.1 to about 20 microns. Coating thickness can be controlled by controlling the flow rate of the organometallic compounds and the length of time over which these compounds are supplied.

Single layer metal oxide coatings, usually of substantially uniform composition throughout, can be achieved with any of the processes described herein. Multiple layer coatings having different compositions are best achieved with MO-MBE or CBE.

Epitaxial, polycrystalline and amorphous metal oxide coating can all be obtained in accordance with this invention.

Ductile superconductive coatings are obtainable by using a ductile substrate, such as a wire or rod of a ductile metal. While the metal oxides formed herein would be quite brittle if formed in bulk, composite articles comprising a thin mixed metal oxide film or coating of this invention on a ductile substrate may be ductile.

For some purposes, ductility is not a requirement for the finished article. A brittle substrate can be used in those cases.

Coatings produced according to this invention usually have a high degree of conformality. That is, the thickness of the coating is very nearly uniform over an irregular rough surface. This is readily achieved with substrate which catalyze decomposition of the organometallic compounds. This can be realized by depositing the coating in the surface kinetic limited regime at relatively low temperatures.

Coatings and films of homogenous composition with controlled grain size and shape can be produced in accordance with this invention.

Products of this invention have a number of uses. Superconductive articles, i.e., those comprising a thin superconductive mixed metal oxide coating or film on a substrate, can be used for magnets and transmission lines, superconducting electronic devices such as Josephson junctions and switches, and superconducting photonic devices such as radiation sensors, can be prepared according to this invention. Magnets and transmission lines require ductile substrates, usually in the form of a wire or rod. Rigid optically smooth single crystal and polycrystalline flat substrates are most useful in electronic device applications. Other uses, for which a non-superconductive mixed metal oxide is satisfactory, include semiconductors, rectifiers, thin film resistors and capacitors, infrared windows and optical elements, ferroelectric materials, long wavelength optical fibers, magnetic thin films for optics and storage, solar cells, surface passivation and biological applications, decorative coatings, and optical mirros and coatings.

Processes of this invention offer a range of composite articles, comprising a mixed metal oxide coating or film on a substrate at low cost. High quality films of excellent purity are obtained. Low operating temperatures can be used, since in general the organometallic precursor compounds used herein have lower decomposition temperatures than their unsubtituted cyclopentadienyl metal analogs. Faster metal oxide deposition rates are made possible, particularly in CVD processes, by the relatively high vapor pressures of the organometallic precursor compounds used herein. The relatively wide "window" or temperature range. between melting point and decomposition temperature makes the precursor compounds herein easy to handle.

Throughout the specification and claims, the limits of all ranges specified in numerical terms shall be qualified by "about" unless the contrary is expressly stated. In this connection, "about" shall not apply to the minimum number of carbon atoms in groups $R_1$, $R_3$, or $R_4$, to the limits of m, p or q, or to the minimum values of u, x or y.

This invention will now be described with reference to the examples which follow.

EXAMPLE 1

This example describes formation of a superconductive coating having the composition $Ba_2YCu_3O_w$ on a $SrTiO_3$ substrate by CVD. The substrate temperature is 800° C. and the reactor pressure is 250 torr. The organometallic precursors are di(isopropylcyclopentadienyl) barium, tri(isopropylcyclopentadienyl) yttrium, and ethylcyclopentadienyl copper triethylphosphine.

After the desired temperature and pressure conditions have been established, conventional initial CVD purging steps are utilized to clean the interior of the reactor. Reactor cleanliness is critical to the successful deposition because the CVD precursors used are extremely air sensitive. After the initial purge of the reactor has been completed with hydrogen, the organometallic precursors in a carrier gas (hydrogen) stream, and the oxidizing agent (a $CO_2/H_2$ mixture) are introduced into the reactor in separate streams close to the substrate. Mole fractions for Ba, Y and Cu precursors in the reactor are about $1.5 \times 10^{-3}$, $7.5 \times 10^{-4}$ and $2.3 \times 10^{-3}$, respectively. These mole fractions can be obtained by setting the Ba and Y precursor bubbler temperatures at 75° C. and setting the flow rates at 1000 sccm for Ba and 500 sccm for Y. The copper precursor bubbler temperature is set at 20° C. and the flow rate is 100 sccm. the mole fraction of the oxidizing agent in the reactor is $10^{-2}$. The lines leading from the source to the reactor are maintained at about 80° C. to avoid reactant condensation. Following the deposition of the oxide compound, the reactor is again purged with hydrogen and cooled to ambient temperature before the removal of the coated substrate.

A number of variations of the procedure described in Example 1 are possible. For example, the oxidizing agent may be an $N_2O/N_2$ mixture or a steam-hydrogen mixture. The carrier gas for the organometallic compounds may be $CO_2$ or a mixture of $CO_2$ and hydrogen. Operating conditions such as pressure, temperatures and flow ratio may be varied. Other substrates and other organometallic precursor compounds may be used, depending on the intended use of the finished article and the desired metal oxide coating composition.

EXAMPLE 2

This example describes formation of mixed metal oxide coatings on a substrate by MO-MBE.

The substrate, organometallic precursor compounds and oxidizing agent are the same as in Example 1. The precursors are admitted into a high vacuum growth chamber and impinged directly line-of-sight onto the heated substrate surface in the form of molecular beams. The substrate temperature is 800° C. and the chamber pressure is $10^{-5}$ torr during growth of the oxide coating. The background pressure in the growth chamber is $10^{-9}$ to $10^{-10}$ torr.

Numerous variations on the procedure of Example 2 are possible. As in Example 1, the substrate and organometallic precursor compounds can be varied in accordance with product requirements. Operating conditions can also be varied. Also, it is possible to prepare multilayer coatings and doped layers by rapid switching of the precursors supplied to the growth chamber when desired layer thicknesses are reached. Low background pressure makes rapid switching possible.

While in accordance with the patent statutes, a preferred embodiment and best mode has been presented, the scope of the invention is not limited thereto, but rather is measured by the scope of the attached claims.

What is claimed is:

1. A chemical vapor deposition process for preparing a composite article comprising a thin mixed metal oxide film coating on a substrate, which comprises: contacting a heated substrate with (1) an oxidizing gas stream and (2) heat decomposable organometallic compounds yielding on decomposition two or more metals of different groups of the Periodic Table and each selected from the group consisting of metals of Group IIA and transition metals of the Periodic Table, said heat decomposable organometallic compounds being contained in one or more nonoxidizing carrier gas streams, said heat decomposable organometallic compounds including at least one compound of the following formula (I)

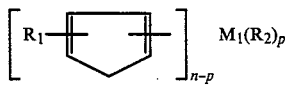
(I)

wherein:
$M_1$ is a metal of Group IIA, IIIB, IVB, VB, VIB, VIIB or VIII of the Periodic Table,
$R_1$ is a lower alkyl or lower alkenyl radical of 2 to about 6 carbon atoms,
$R_2$ is hydrogen, fluoring, a lower alkyl radical of 1 to 6 carbon atoms, or a lower alkenyl radical of 2 to 6 carbon atoms,
n is the valence of $M_1$ and is an integer from 2 to 4, and
p is an integer from 0 to (n−1);
or a compound of the following formula (II)

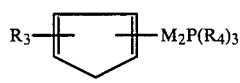
(II)

wherein;

$M_2$ is a metal of Group IB of the Periodic Table;
$R_3$ is a lower alkyl radical of 1 to about 6 carbon atoms, or a lower alkenyl radical of 2 to about 6 carbon atoms; and
$R_4$ is a lower alkyl radical of 1 to 6 carbon atoms;
the temperature of said substrate being from 150° to 1000° C. and above the decomposition temperatures of said organometallic compounds.

2. A process according to claim 1 with the following provisos:
   (1) $M_1$ is a metal of Group IIA, IIIB, IVB, VB, VIB, or VIII when p=0;
   (2) $M_1$ is a Group IVB metal and n=3 or 4 when $R_2$ is fluorine;
   (3) $M_1$ is a metal of Group VB, VIB or VIIB when $R_2$ is hydrogen; and
   (4) $M_1$ is a Group VIII metal when $R_2$ is lower alkyl or lower alkenyl.

3. A process according to claim 2 in which said heat decomposable organometallic compounds consist essentially of one or more compounds of the formula (I) and optionally one or more compounds of the formula (II).

4. A process according to claim 1 in which $M_2$ is copper or silver.

5. A process according to claim 1 in which the thickness of said coating is from 0.1 to 100 microns.

6. A process according to claim 1 in which organometallic compounds are supplied in a stream of non oxidizing carrier gas.

7. A process for preparing a composite article comprising a thin mixed metal oxide coating on a substrate, wherein the mixed metal oxide coating has the general formula $$A_u B_x Cu_y O_z$$

ps in which:
A is a calcium, strontium or barium;
B is a Group IIIB metal,
u is from 1 to about 10,
x is from 1 to about 10,
y is from 1 to about 10, and
z is from about 3 to about 40 and is such as to satisfy the valences of A, B and Cu, said process comprising contacting a heated substrate with (1) an oxidizing gas stream and (2) a carrier gas containing heat decomposable organometallic compounds of metal A, metal B, and copper, at least one of the compounds of metal A and metal B having the formula (I)

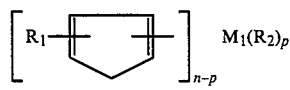
(I)

wherein:
$M_1$ is a metal of Group II-A or Group IIIB,
$R_1$ is a lower alkyl radical of 2 to 6 carbon atoms,
$R_2$ is absent, and
n=2 or 3=the valence of metal $M_1$, and
p=0.

8. A process according to claim 7 in which the organometallic copper compound has the following formula (II-a)

 (II)

wherein $R_3$ and $R_4$ are each lower alkyl radicals of 1 to 6 carbon atoms.

9. A process according to claim 7 in which said organometallic compounds consist essentially of a compound of the formula (III)

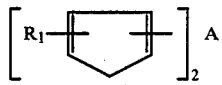 (III)

a compound of the formula (IV)

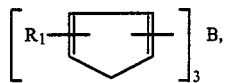 (IV)

and a compound of the formula (II-a)

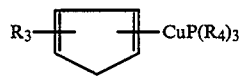 (II-a)

wherein A, B, $R_1$, and $R_4$ are as previously defined.

10. A process according to claim 7 in which said carrier gas is an oxidizing gas or an inert gas.

11. A process according to claim 1 in which each of said heat decomposable organometallic compounds has a vapor pressure of at least 0.1 torr at 100° C. and is thermally stable at temperatures below about 150° C.

* * * * *